(12) United States Patent
Martin et al.

(10) Patent No.: US 8,910,590 B2
(45) Date of Patent: Dec. 16, 2014

(54) PLASMA DEPOSITION

(75) Inventors: Conor Nicholas Martin, Cremorne (AU); Guy Reynolds, Helensburgh (AU); Piotr Glowacki, Umina Beach (AU); Satyanarayan Barik, Holroyd (AU); Patrick Po-Tsang Chen, Macquarie Park (AU); Marie-Pierre Francoise Wintrebert Ep Fouquet, Silverwater (AU)

(73) Assignee: Gallium Enterprises Pty Ltd., New South Wales (AU)

( * ) Notice: Subject to any disclaimer, the term of this patent is extended or adjusted under 35 U.S.C. 154(b) by 394 days.

(21) Appl. No.: 13/201,280

(22) PCT Filed: Feb. 12, 2010

(86) PCT No.: PCT/AU2010/000149
§ 371 (c)(1),
(2), (4) Date: Dec. 6, 2011

(87) PCT Pub. No.: WO2010/091470
PCT Pub. Date: Aug. 19, 2010

(65) Prior Publication Data
US 2012/0070963 A1    Mar. 22, 2012

(30) Foreign Application Priority Data

Feb. 13, 2009 (AU) .................................. 2009900611
Feb. 13, 2009 (AU) .................................. 2009900612

(51) Int. Cl.
*H01J 37/32* (2006.01)
(Continued)

(52) U.S. Cl.
CPC ......... *H01J 37/32449* (2013.01); *C23C 16/303* (2013.01); *C23C 16/452* (2013.01);
(Continued)

(58) Field of Classification Search
CPC ... H01L 21/20; H01L 21/36; H01L 21/02172; H01L 21/00; H01L 21/28202; H01J 37/32633; H01J 37/3244; H01J 37/32449; H01J 37/32357

USPC ................. 438/478; 118/723 R; 137/561 R; 257/E21.09
See application file for complete search history.

(56) References Cited

U.S. PATENT DOCUMENTS 7,479,191 B1 * 1/2009 Entley et al. ..................... 134/1
8,192,688 B2 * 6/2012 Hagen et al. ................. 422/129
(Continued)

FOREIGN PATENT DOCUMENTS

| JP | 2005085956 A | * | 3/2005 | |
| WO | 2006034540 A1 | | 4/2006 | |
| WO | WO 2006034540 A1 | * | 4/2006 | ............. C23C 16/34 |

OTHER PUBLICATIONS

Kim et al., "Effect of Hydrogen on GaN Growth by Remote Plasma-Enhanced Metal-Organic Chemical Vapor Deposition,"Physica Status Solidi (a), vol. 176, Issue 1, 1999, pp. 337-342 [online], [retrieved Apr. 14, 2010].

(Continued)

*Primary Examiner* — Jarrett Stark
*Assistant Examiner* — Bitew Dinke
(74) *Attorney, Agent, or Firm* — Fredrikson & Byron, P.A.

(57) ABSTRACT

An apparatus for depositing a group III metal nitride film on a substrate, the apparatus comprising a plasma generator to generate a nitrogen plasma from a nitrogen source, a reaction chamber in which to react a reagent comprising a group III metal with a reactive nitrogen species derived from the nitrogen plasma so as to deposit a group III metal nitride on the substrate, a plasma inlet to facilitate the passage of nitrogen plasma from the plasma generator into the reaction chamber and a baffle having one or more flow channels for passage of the nitrogen plasma. The baffle is located between the plasma inlet and the substrate and prevents a direct line of passage for nitrogen plasma between the plasma inlet and the substrate.

10 Claims, 12 Drawing Sheets

(51) Int. Cl.
| | |
|---|---|
| *H01L 21/28* | (2006.01) |
| *C23C 16/30* | (2006.01) |
| *C23C 16/452* | (2006.01) |
| *C23C 16/455* | (2006.01) |
| *C30B 29/40* | (2006.01) |
| *H01L 21/02* | (2006.01) |
| *C30B 25/10* | (2006.01) |
| *C30B 25/16* | (2006.01) |

(52) U.S. Cl.
CPC ....... *C23C 16/45523* (2013.01); *H01J 37/3244* (2013.01); *C30B 29/403* (2013.01); *H01L 21/0262* (2013.01); *H01J 37/32357* (2013.01); *H01J 37/32422* (2013.01); *H01J 37/32633* (2013.01); *C30B 25/105* (2013.01); *C30B 25/165* (2013.01); *H01L 21/0237* (2013.01); *H01L 21/02521* (2013.01)
USPC ................ 118/723 R; 438/478; 137/561 R; 257/E21.09

(56) References Cited

U.S. PATENT DOCUMENTS

| | | | | |
|---|---|---|---|---|
| 8,291,857 | B2* | 10/2012 | Lam et al. | 118/723 ME |
| 8,580,076 | B2* | 11/2013 | Becknell et al. | 156/345.25 |
| 8,591,659 | B1* | 11/2013 | Fang et al. | 134/1.1 |
| 2004/0238123 | A1* | 12/2004 | Becknell et al. | 156/345.33 |
| 2006/0225654 | A1 | 10/2006 | Fink | 118/723 R |
| 2006/0286782 | A1* | 12/2006 | Gaska et al. | 438/483 |
| 2007/0128864 | A1* | 6/2007 | Ma et al. | 438/680 |
| 2007/0227554 | A1* | 10/2007 | Satoh et al. | 134/1.1 |
| 2008/0178805 | A1* | 7/2008 | Paterson et al. | 118/723.1 |
| 2008/0272463 | A1* | 11/2008 | Butcher et al. | 257/615 |
| 2009/0042407 | A1* | 2/2009 | Bang et al. | 438/787 |
| 2009/0081109 | A1* | 3/2009 | Einav | 423/409 |
| 2009/0289014 | A1* | 11/2009 | Hoeppner | 210/741 |
| 2010/0136770 | A1* | 6/2010 | Einav | 438/483 |
| 2010/0311229 | A1* | 12/2010 | Einav | 438/483 |
| 2011/0011338 | A1* | 1/2011 | Chuc et al. | 118/715 |
| 2013/0171038 | A1* | 7/2013 | Choi | 422/186.03 |
| 2013/0292047 | A1* | 11/2013 | Tian et al. | 156/242 |
| 2013/0315795 | A1* | 11/2013 | Bera et al. | 422/310 |

OTHER PUBLICATIONS

Zhu et al., "Effects of indium surfactant on optical and structural properties of MBE grown GaN," Materials Research Society Proceedings, 2000, pp. 44-57.
Newman, "Thermochemistry of III-N. Semiconductors," Semiconductors and Semimetals, vol. 50, 1998, pp. 55-101.
Kim et al., Abstract for "Effect of Hydrogen on GaN Growth by Remote Plasma-Enhanced Metal-Organic Chemical Vapor Deposition, "Physica Status Solidi (a), vol. 176, Issue 1, 1999, pp. 337-342 [online], [retrieved Apr. 14, 2010].
Zhu et al., Abstract for "The Effect of Indium Surfactant on the Optoelectronic and Structural Properties of MBE Grown Gallium Nitride," Materials Research Society Proceedings, vol. 618, 2000, pp. 153-158 (see abstract and section "Experiment").
"PCT International Search Report dated Apr. 14, 2010 for PCT/AU2010/000149, from which the instant application is based," 6 pgs.
"PCT Written Opinion dated Apr. 14, 2010 for PCT/AU2010/000149, from which the instant application is based," 6 pgs.
"PCT Demand dated Jun. 10, 2010 for PCT/AU2010/000149, from which the instant application is based," 6 pgs.
"PCT International Preliminary Report on Patentability dated May 19, 2011 for PCT/AU2010/000149, from which the instant application is based," 12 pgs.

* cited by examiner

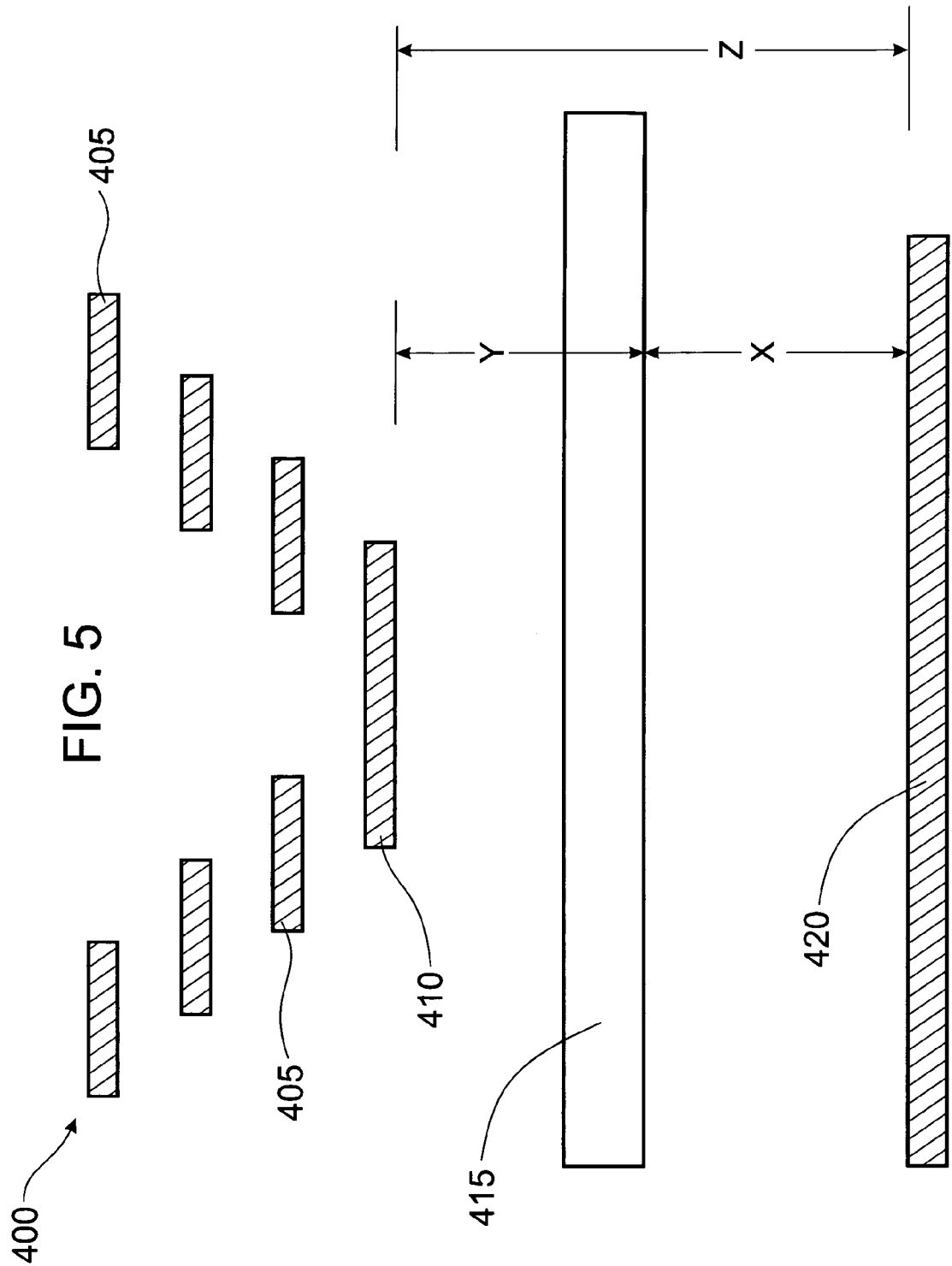

PLASMA DEPOSITION

RELATED APPLICATIONS

This application claims priority to International Application No. PCT/AU2010/000149 filed Feb. 12, 2010, and to Australian Patent Applications Nos. 2009900611 and 2009900612, both filed Feb. 13, 2009, the teachings of which are incorporated herein by reference.

FIELD OF THE INVENTION

The present invention relates to an apparatus and method for the production of group III metal nitride films.

BACKGROUND OF THE INVENTION

Group III metal nitride films, such as gallium nitride (GaN) films, have applications in a range of devices from light emitting diodes (LEDs) to ultraviolet detectors to transistor devices.

These films have commonly been produced by techniques including molecular beam epitaxy (MBE) and metal organic chemical vapour deposition (MOCVD). These techniques are not entirely satisfactory with MOCVD, for example, requiring operating temperatures of approximately 1000° C. while with MBE it is difficult to regulate the production of higher energy species due to the use of relatively low film growth pressures.

More recently, remote plasma enhanced chemical vapour deposition (RPECVD) has been employed to produce films of high quality at considerably lower temperatures which reduces equipment costs and allows the use of temperature sensitive preferred substrates for film deposition. RPECVD also typically employs much higher pressures enabling better control of high energy species resulting in less film damage relative to the MBE process.

The use of RPECVD in the production of group III metal nitride films is disclosed in the inventor's earlier patent application WO2006/034540 (Macquarie University) which is entirely incorporated herein by reference.

One problem which must be addressed during film production is that the active nitrogen species from the nitrogen plasma can be quite damaging to group III metal nitride material as it forms. The damage occurs because the active nitrogen species causes etching of the substrate upon collision during growth due to the relatively high kinetic and/or potential energy it possesses.

In the case of damage from species with high energy, these species, largely charged ionic or electron species, are reduced in RPECVD by the physical distance between the plasma source and the sample surface and by the presence of a relatively high density of unexcited gas molecules between the plasma source and sample at typical pressures of between 0.01 Torr and 15 Torr as described in WO2006/034540. However, as further outlined in WO2006/034540, damage can also result from the longer lived neutral species generated in the plasma if these species have substantial potential energy. The potential energy of neutral atomic and molecular species that may participate in film growth are listed by Newman [N. Newman, "Thermochemistry of III-N Semiconductors" in Gallium Nitride I, edited by J. I. Panove and T. D. Moustakas, Vol. 50 of Semiconductors and Semimetals (Academic Press, 1998) pg. 86-89].

The potential energy of such species can only be transformed or lost in discrete quanta of potential energy, so energy in excess of that lost though chemical formation is largely kinetic, which is lost through collisions and heating mechanisms. The collision damage is often seen as sample etching and can negatively affect the resulting film properties.

An apparatus and method was described in WO2006/034540 which allowed this problem to be addressed to a useful extent. However, the present inventors have now identified a particular apparatus and process details, some elements of which may be broadly described in WO2006/034540, which have been shown to result in greatly improved film quality.

SUMMARY OF THE INVENTION

In a first aspect, although it need not be the only or indeed the broadest form, the invention resides in an apparatus for depositing a group III metal nitride film on a substrate, the apparatus comprising:
(a) a plasma generator to generate a nitrogen plasma from a nitrogen source;
(b) a reaction chamber in which to react a reagent comprising a group III metal with a reactive nitrogen species derived from the nitrogen plasma so as to deposit a group III metal nitride on the substrate;
(c) a plasma inlet to facilitate the passage of nitrogen plasma from the plasma generator into the reaction chamber; and
(d) a baffle having one or more flow channels for passage of the nitrogen plasma, the baffle located between the plasma inlet and the substrate,
wherein the baffle prevents a straight line of passage for nitrogen plasma between the plasma inlet and the substrate.

Preferably, the baffle comprises a plurality of at least partially overlapping distribution members located above a blocking member, each distribution member defining an aperture and being spaced from adjacent distribution members and the blocking member.

Suitably, the apertures defined by the distribution members are progressively smaller upon approaching the blocking member.

In a second aspect the invention resides in a plasma baffle comprising:
(a) a first distribution member defining an entry aperture;
(b) a blocking member; and
(c) one or more connecting members disposed circumferentially and extending between the first distribution member and the blocking member to space the first distribution member and the blocking member apart;
wherein the space between the first distribution member and the blocking member defines a plasma flow channel.

In a third aspect the invention resides in a process for depositing a group III metal nitride film on a substrate the method comprising the steps of:
(a) producing a nitrogen plasma using a plasma generator and a nitrogen source;
(b) introducing the nitrogen plasma into a reaction chamber via a plasma inlet;
(c) passing the nitrogen plasma through a baffle having one or more flow channels for passage of the nitrogen plasma, the baffle located between the plasma inlet and the substrate and preventing a straight line of passage for nitrogen plasma between the plasma inlet and the substrate; and
(d) injecting a reagent comprising a group III metal into the reaction chamber at a point between the baffle and the substrate,
to thereby deposit the group III metal nitride film on the substrate.

In a fourth aspect the invention resides in a group III metal nitride film made by the process of the second aspect.

In a fifth aspect the invention resides in use of a group III metal nitride film of the third aspect in a semiconductor device.

Further features of the present invention will become apparent from the following detailed description.

Throughout this specification, unless the context requires otherwise, the words "comprise", "comprises" and "comprising" will be understood to imply the inclusion of a stated integer or group of integers but not the exclusion of any other integer or group of integers.

BRIEF DESCRIPTION OF THE FIGURES

In order that the invention may be readily understood and put into practical effect, preferred embodiments will now be described by way of example with reference to the accompanying figures wherein:

FIG. 5 shows a schematic representation of one embodiment of the relative positioning of an inverse pagoda baffle, a reagent injector and a substrate;

DETAILED DESCRIPTION OF THE INVENTION

The present inventors have identified a particular apparatus for the production of group III metal nitride films which results in a substantial reduction in substrate and/or film damage due to unwanted high energy activated nitrogen species collisions, while at the same time promoting advantageously uniform growth of high quality group III metal nitride films.

The inventors have further identified the value of varying one or more distances within the reaction chamber and introducing a scavenging gas and/or a surfactant to the reaction environment in producing films of high quality in an industrially efficient process.

Figure 1:
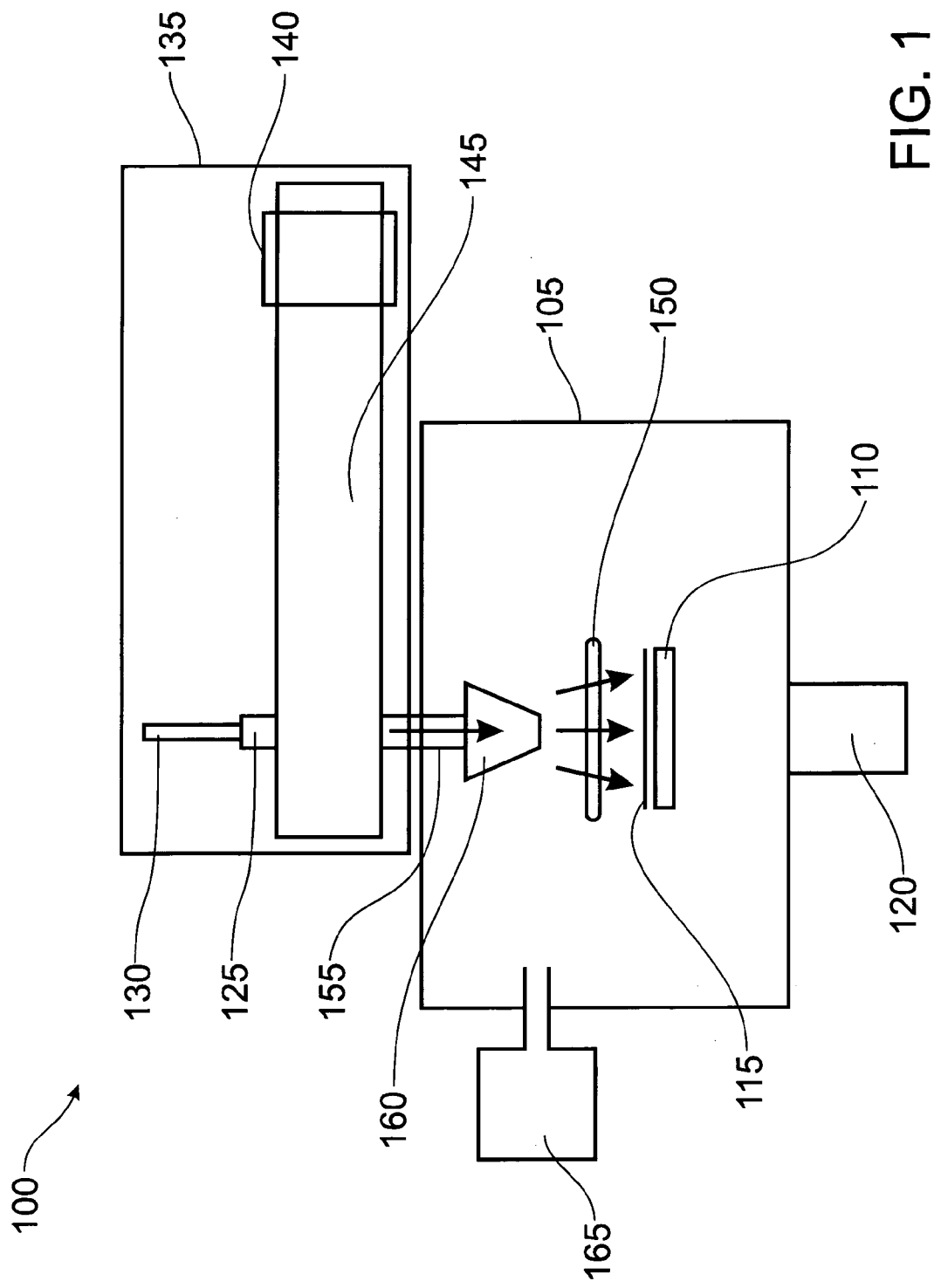
FIG. 1 shows a schematic representation of one embodiment of an apparatus for depositing a group III metal nitride film on a substrate.

FIG. 1 shows a schematic representation of one embodiment of an apparatus 100 for depositing a group III metal nitride film on a substrate. FIG. 1 is shown merely for the purpose of demonstrating the general layout of the various components required. Apparatus 100 comprises a reaction chamber 105 which houses a substrate support 110 to provide support for a substrate 115. Substrate 115 will have a crystal structure that is suitable for growth of the particular group III metal nitride film desired.

Reaction chamber 105 is evacuated before growth of the film by means of a vacuum pump 120. Reaction chamber 105 is connected to nitrogen plasma generator 135 via feed tube 125 which receives nitrogen from inlet 130. Plasma generator 135 comprises radiofrequency power source 140 and waveguide 145 and, in conjunction with feed tube 125, provides a stream of active neutral nitrogen species into reaction chamber 105. The stream passes through RPECVD connection 155 and exits a plasma inlet (not shown) to then pass into a baffle 160. This flow path for the active nitrogen species aids in substantially eliminating those with an energy greater than or equal to the bond energy of the group III metal nitride bond, as will be discussed in greater detail below.

The group III metal reagent is introduced into reaction chamber 105 using a reagent injector 150 and comes into contact with the nitrogen plasma to result in deposition of the group III metal nitride film on substrate 115. In one embodiment a laser 165 may be used to aid in inducing deposition.

Figure 2:
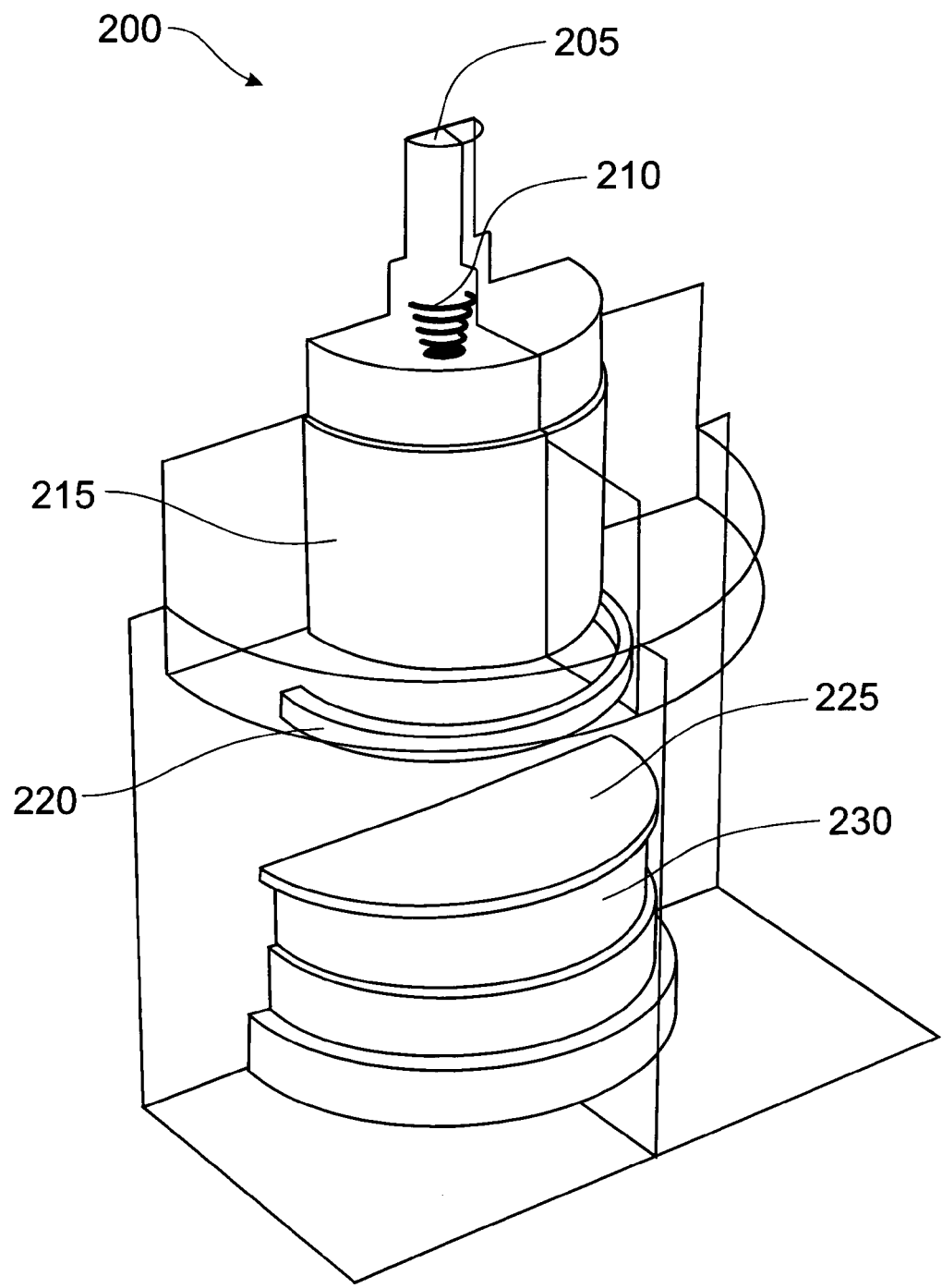
FIG. 2 shows a perspective cut away view of one embodiment of an apparatus for depositing a group III metal nitride film on a substrate and indicates the position of the inverse pagoda baffle.

FIG. 2 shows a perspective cut away view of one embodiment of an apparatus 200 for depositing a group III metal nitride film on a substrate and indicates the position of the inverse pagoda baffle. While FIG. 1 was a general representation of the components, FIG. 2 shows the inventive embodiment of a baffle being an inverse pagoda baffle 210 which receives nitrogen plasma from feed tube 205 (details of the plasma generator not shown in FIG. 2). Inverse pagoda baffle 210 is seen to sit just below feed tube 205 so that nitrogen plasma entering the reaction chamber must pass through it. This ensures that the high energy activated nitrogen species are modulated to substantially reduce or eliminate those species which could be damaging to the substrate and/or growing film while at the same time distributing the plasma over a wider area in a uniform manner to improve film growth.

In the embodiment shown the plasma, after passing through inverse pagoda baffle 210, is directed into a shroud 215 which may take the form of a vertical cylinder or the like. Shroud 215 is an optional component but, under certain operating conditions, may be useful in directing the lateral flow of the reactive species exiting inverse pagoda baffle 210 downward (below the inverse pagoda) in a uniform flow towards a substrate 225 which is held in place by substrate support 230. After passing through inverse pagoda baffle 210 and, optionally, shroud 215 the plasma then passes over and around reagent injector 220 which, in FIG. 2, is shown in the form of a ring.

The apparatus 200 described and, particularly, inverse pagoda baffle 210 result in such a dispersion of activated nitrogen plasma over substrate 225 that, once the group III metal reagent is introduced it results in uniform deposition, across the available face of substrate 225, of a high quality film.

Figure 3A:
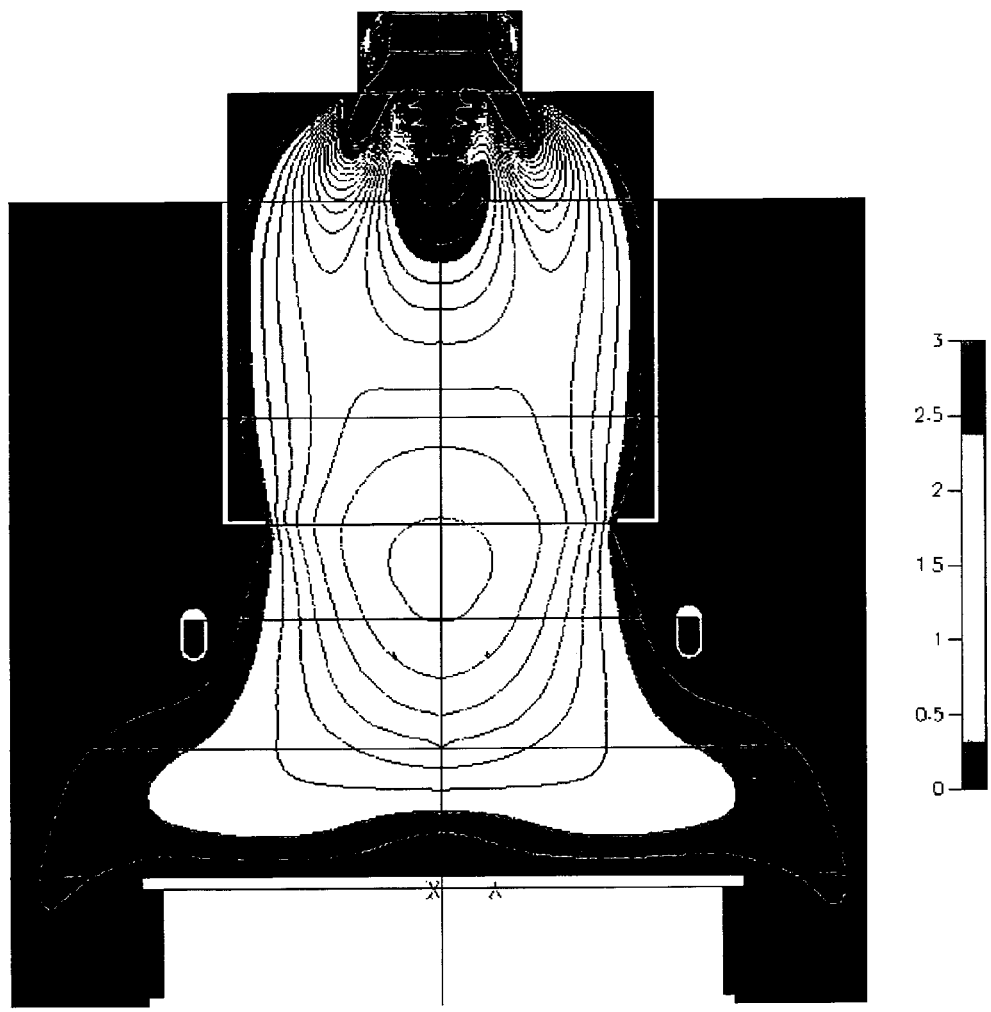
FIGS. 3A and 3B show a molecular modelling representation of plasma flow with and without an inverse pagoda baffle.
Figure 3B:
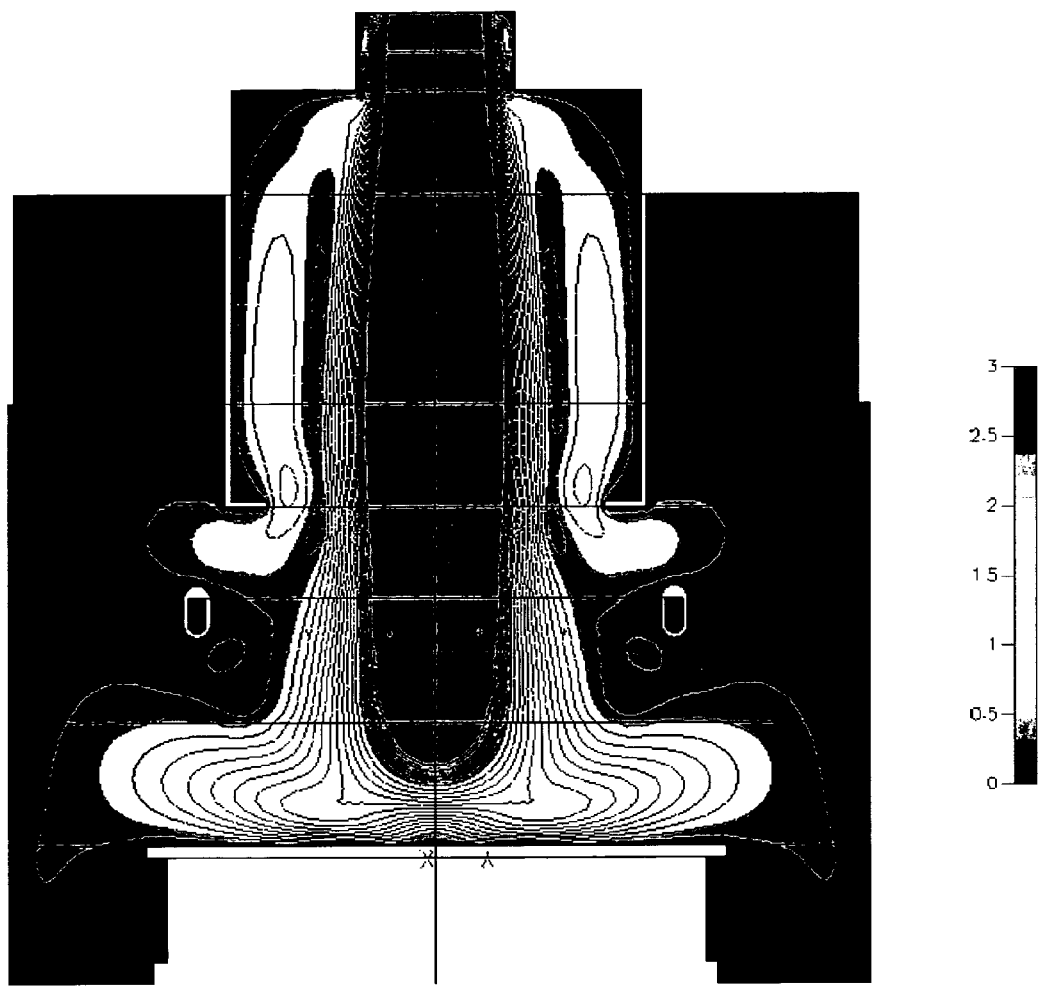

It is known that a high velocity plasma gas flow directly onto the substrate and/or growing film can be damaging and result in poor film quality. FIGS. 3A and 3B show this effect and demonstrate how it can be alleviated by use of an inverse pagoda style baffle. FIG. 3A shows plasma flow velocity in m/s with the use of an inverse pagoda baffle which can be made out in outline at the top of the figure. FIG. 3B shows plasma flow velocity in m/s when the inverse pagoda baffle is absent.

It can be seen from FIG. 3A that the inverse pagoda baffle redirects flow so that the plasma reaching the substrate has a relatively low velocity compared to when it enters the baffle. In contrast FIG. 3B indicates the damage that can potentially be caused to the substrate due to plasma with a high flow velocity being directed towards and colliding with it.

Figure 4A:
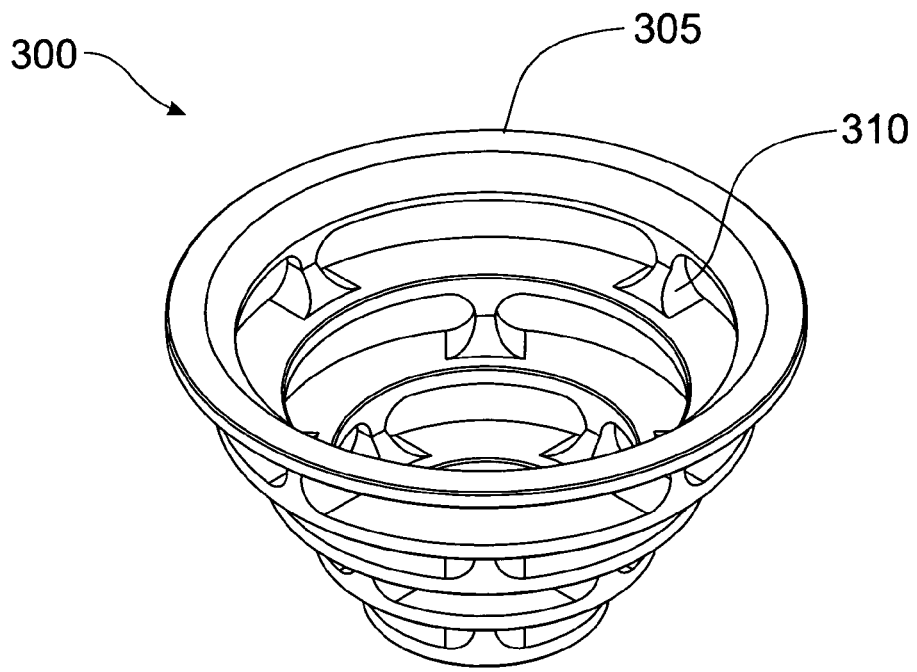
FIG. 4A shows a top perspective view of one embodiment of an inverse pagoda baffle.
Figure 4B:
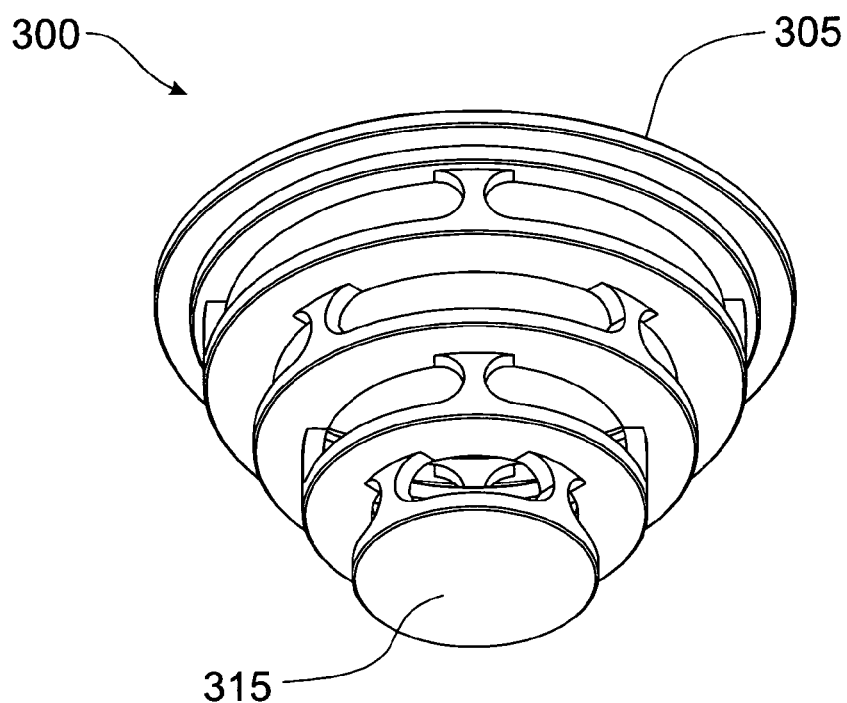
FIG. 4B shows a bottom perspective view of the inverse pagoda baffle shown in FIG. 4A.

FIGS. 4A and 4B show perspective views of one embodiment of a baffle 300 which will be referred to hereinafter as an inverse pagoda baffle. Inverse pagoda baffle 300 comprises a plurality of spaced substantially parallel distribution members, hereinafter referred to as rings 305, which, in moving vertically down inverse pagoda baffle 300, are of progressively smaller diameter. This results in consecutive rings 305 at least partially overlapping. Each ring 305 (other than the largest diameter ring) is connected to the ring 305 above and below it by one or more circumferentially disposed connecting members 310 extending from a lower face of one ring 305 to an upper face of the adjacent ring 305 or of solid disc 315. Beneath the smallest ring 305 and being partially overlapped by it is a blocking member, hereinafter referred to as a solid disc 315, which is not provided with any apertures.

It will be appreciated that the result of the design of the inverse pagoda baffle 300 is that, in use, it prevents a direct line of passage for nitrogen plasma between the plasma inlet and the substrate. This is because, when viewed from above looking directly down to solid disc 315, rings 305 overlap in such a manner that it appears as one solid circle without any apertures for flow of nitrogen plasma. The perspective views of FIGS. 4A and 4B, however, show that the spaces between parallel rings 305 provide the necessary flow channels.

It is also important to appreciate the placement of connecting members 310 with respect to one another. It can be seen from the figures that each connecting member 310 is circumferentially offset from the connecting members 310 both above and below it. This provides important advantages in creating a uniform distribution of plasma flow. It will be appreciated that if all connecting members 310 were aligned then that particular vertical region of inverse pagoda baffle 300 would have a disrupted plasma flow path and the dispersion of plasma flow velocity into the deposition zone would have a less than ideal homogeneity. The offset design enables any minimal disruptions to flow to be essentially randomised so as to show little or no noticeable effect.

It will also be appreciated that the inverse pagoda baffle 300 need not conform in terms of shape to that shown in FIGS. 4A and 4B. For example, rings 305 and solid disc 315 need not be circular; they may be square, rectangular, pentagonal, hexagonal, octagonal or even somewhat non-geometric. They may take a wide range of shapes so long as a direct line of passage for the active nitrogen species between plasma inlet and substrate is prevented and the alternative version of rings 305 have spaces between them to uniformly distribute the plasma flow as previously described. The inverse pagoda 300 design shown in FIGS. 4A and 4B, however, is believed to be a particularly effective, preferred design.

The inventors have found, through experimentation, that the design of the inverse pagoda baffle shown in FIGS. 4A and 4B employing spaced interconnected rings of progressively smaller diameter ending in a solid disc with offset connecting structures is a particularly useful one in terms of achieving appropriate modulation of plasma flow velocity and control of high energy active nitrogen species as well as actively promoting a uniform flow evenly distributed over the desired deposition region.

In use, nitrogen plasma will pass from a plasma generator into the reaction chamber through a plasma inlet upon which it is directed into inverse pagoda baffle 300, as shown in FIGS. 4A and 4B, entering through the aperture of the largest diameter ring 305. The plasma will flow through each of the spaces between adjacent rings 305 and will be distributed by rings 305 to thereby create a uniform dispersion. Any plasma which passes directly through the apertures of all of rings 305 will contact solid disc 315 at the lower extent of inverse pagoda baffle 300 and in this manner will be forced through the space between the smallest diameter ring 305 and solid disc 315.

The effect of this directed flow path is two fold. Firstly, as mentioned, the distribution of the nitrogen plasma through the plurality of spaces between adjacent rings 305 and circumferentially offset connecting members 310 creates an extremely uniform flow and tempers plasma flow velocity appropriately. This is further discussed and demonstrated in the example section. This greatly assists in producing a uniform deposition of group III metal nitride across the surface of the substrate upon reaction with the metal reagent.

Secondly, as the nitrogen plasma contacts inverse pagoda baffle 300 the energy of the active nitrogen species is modulated so as to substantially eliminate those which have an energy greater than the bond energy of the group III metal nitride. This can be achieved by collision of the nitrogen species with rings 305, solid disc 315 and even ring connectors 310.

Preferably, the inverse pagoda baffle is made of 304 stainless steel.

In one embodiment, an inverse pagoda baffle of the invention may comprise one or more flaps or projections extending from the members or rings and located within the space between one or more adjacent rings. The projection(s) provide a means to direct the plasma flow passing through in a substantially horizontal direction to proceed in a substantially vertical direction. This assists in generating a gas volume free of return flow zones which minimises the amount of gas phase pre-reactions taking place in the deposition chamber and greatly improves group III metal organic reagent usage efficiency. This effect becomes of increasing importance with larger substrate/deposition areas. In embodiments of the invention wherein one or more flaps are provided on the inverse pagoda baffle then the use of a shroud will be unnecessary.

The projections may extend vertically downwards from the underside of one or more of rings 305 to approximate an L-shape when viewing the inverse pagoda baffle in cross section. This shape is indicated on FIG. 7 which is discussed in greater detail below. The projections effectively create multiple shrouds which re-direct the flow of plasma gas from substantially horizontal to substantially vertical and reduces interactions between the flow zones of the baffle. This results in a gas volume free of return flow zones thereby maximising uniformity.

In an alternative embodiment the inverse pagoda baffle may be used in combination with a plate or 'shower head' style baffle as are known in the art. The combination of the two different styles of baffle may provide certain advantages under specific process conditions. Note that the combination will still prevent a direct line of sight between plasma inlet and substrate due to the presence of the inverse pagoda style baffle.

The inverse pagoda baffle may be electrically uncharged. It may modulate the speed and/or direction of entry of said species into the reaction chamber, or into the intermediate zone of the reaction chamber.

There may be between about 2 to about 10 rings in a suitable inverse pagoda baffle, preferably about 3 to 6 rings. Each may, independently, have an inside diameter of about 0.5 to about 10 cm and the gaps between any two adjacent rings may, independently, be about 0.1 to about 1 cm.

The inventors have found that the use of an inverse pagoda baffle as described above provides distinct advantages both in terms of reducing the chance of a damaging high energy activated nitrogen species contacting the substrate and/or growing film and in creating a uniform distribution of the plasma to cover the entire surface of the substrate. The use of baffles per se, specifically flat plate baffles and/or fan like impellers, to reduce the incidence of etching due to unwanted high energy nitrogen species is disclosed, to an extent, in the inventor's prior application, WO2006/034540, but the substantial improvements in film quality obtained by the use of the inverse pagoda style baffle of the present invention is in no way disclosed or even suggested in the prior art. Particularly, it has not been discussed or suggested in the prior art to force the generally downward flow of the nitrogen plasma to adopt a lateral flow direction by the use of spaced rings, or like structures, to thereby create a uniform flow with a controlled flow velocity to evenly cover the deposition zone. Further, the prior art also does not disclose the advantages of employing overlapping rings and a disc to create a flow path which cannot present a direct line of passage for active nitrogen species from the plasma inlet to the substrate. It could not have been predicted that a design as described herein would provide the very substantial benefits which have been observed experimentally.

A cooler may be provided for cooling the inverse pagoda baffle. This may take the form of a heat exchanger. It may comprise one or more tubes passing through and/or past (and in thermal contact with e.g. on a face of) the inverse pagoda baffle. The tube(s) may be coupled to a chiller for providing a cooled heat exchange fluid to the tube(s).

Production of the reactive nitrogen species in the plasma generator requires substantial energy input, and some of that energy may result in heating of the reactive nitrogen species and other gaseous matter that pass from the plasma generator to the reaction chamber. On contact with the metal organic reagent in the reaction chamber, the reactive nitrogen species can interact with the reagent to form the group III metal nitride. It is preferable to encourage this formation on the substrate and to discourage it on other surfaces. This cooling of the inverse pagoda baffle can promote preferential formation of the group III metal nitride film on the substrate rather than on other surfaces such as the walls of the reaction chamber, the reagent injector etc.

The plasma generator produces a nitrogen plasma to provide active nitrogen species for reaction with the group III metal reagent. Preferably, the plasma generator is a radiofrequency (RF) plasma generator. In a preferred embodiment the plasma generator is a helicon RF plasma generator. The RF plasma generator may be used at a pressure substantially higher than is commonly used for a helicon plasma generator. It may be used at a pressure of about 0.01 to about 15 Torr. It may operate on a continuous input signal or it may operate on a pulsed input signal. The RF plasma generator may, for example, operate at about 13.56 MHz.

In one embodiment, the helicon plasma generator is operating in non-helicon mode due to the absence of a magnetic field.

The plasma generator and the plasma inlet leading from the plasma generator to the reaction chamber may, independently, comprise a plasma resistant coating. The plasma resistant coating may comprise for example alumina, quartz, fused silica, borosilicate glass, boron nitride or some other suitably resistant material.

As discussed, the reaction chamber has a plasma inlet coupled to the plasma generator so as to allow the reactive nitrogen species to enter the chamber. The plasma inlet may open directly from the plasma generator or there may be a transporting mechanism, e.g. a tube or channel, for transporting the plasma, or reactive nitrogen species produced therein, to the reaction chamber. The reaction chamber may be considered to be divided into three zones: an injection zone, an intermediate zone and a growth zone. Reaction of the reagent with the reactive nitrogen species may occur in the intermediate zone. Deposition of the group III metal nitride occurs in the growth zone.

One or more reagent injectors are provided to inject the group III metal reagent into the reaction chamber. In most cases the reagent is a gas or a vapour under the injection conditions and is commonly injected in a carrier gas. Commonly the reagent injector comprises a plurality of apertures for injecting the reagent into the reaction chamber. This enables the reagent to be injected over a relatively large area, thereby contributing to the homogeneity of the group III metal nitride film produced, and to the ability to generate relatively large areas of nitride film on the substrate. In some cases one or more of the reagent injectors are coupled to, optionally affixed to, the inverse pagoda baffle. One or more of the reagent injector(s) may be in the form of a ring, e.g. a torus. In this case, the injector in the form of the ring may be located in one or more planes between the inverse pagoda baffle and the substrate, so that the metal organic reagent is injected into the reaction chamber only after the reactive nitrogen species has passed through the flow channels within the inverse pagoda baffle.

The inventors have also realised that varying certain distances within the reaction chamber can be extremely important in achieving a high quality group III metal nitride film. FIG. 5 shows a schematic representation of one embodiment of the relative positioning of apparatus 400 comprising an inverse pagoda baffle 405, a reagent injector 415 and a substrate 420.

FIG. 5 is a simple representation purely to illustrate key distances X, Y and Z. Hence, no detail of inverse pagoda baffle 405 is shown other than an indication of the positions of the rings and solid disc 410. Distance Y represents the distance between the underside of solid disc 410 of inverse pagoda baffle 405 and the exit surface for the group III metal reagent on reagent injector 415. Distance X represents the distance between the exit surface for the group III metal reagent on reagent injector 415 and the deposition face of substrate 420. Z represents the combined distance of X and Y.

Suitable distances for X and Y will depend on the size of the reaction chamber and the properties which are desired from the group III metal nitride film. In a preferred embodiment both X and Y are independently between about 0.5 cm to about 20 cm, preferably about 2 to about 10 cm. X and Y may be varied for each layer of a group III metal nitride film which is being laid down to tailor the properties of that layer for a particular application.

Variation of distances X and Y may be achieved by the reaction chamber having variable height and/or length. It may have a mechanism for varying the height and/or length of the chamber such as an extender mechanism. The height and/or length may be varied by a linear drive mechanism with limit switches setting the upper and lower limits of travel. The linear drive can be programmed based on the distance traveled between the limit switches.

The varying of distances X and Y can serve to control the growth rate of the film on the substrate, the nature of the one or more reactive nitrogen species derived from the nitrogen plasma which actually reach the substrate, the temperature in selected regions of the reaction chamber (e.g. at the sample surface), the flow of the one or more reactive nitrogen species derived from the nitrogen plasma through the reaction chamber, the uniformity of the film formed on the substrate surface, or more than one of these parameters. The varying may be used to improve or at least partially optimise desired properties of the film formed on the substrate surface.

In one embodiment, the present invention resides in an apparatus for depositing a group III metal nitride film on a substrate, the apparatus comprising:
(a) a plasma generator to generate a nitrogen plasma from a nitrogen source;
(b) a reaction chamber comprising a reagent injector to deliver a reagent comprising a group III metal for reaction with a reactive nitrogen species derived from the nitrogen plasma;
(c) a plasma inlet to facilitate the passage of nitrogen plasma from the plasma generator into the reaction chamber; and
(d) a baffle having one or more flow channels for passage of the nitrogen plasma, the baffle located between the plasma inlet and the substrate,
wherein the distance between the baffle and the reagent injector and/or the distance between the reagent injector and the substrate can be varied.

Preferably, the baffle is an inverse pagoda baffle. The inverse pagoda baffle comprises a plurality of spaced substantially parallel rings of progressively smaller diameter with the smallest ring located adjacent a solid disc.

Suitably, the distance between the baffle and the reagent injector extends from the solid disc of the inverse pagoda baffle to a reagent injection face of the reagent injector.

Preferably, the distance between the reagent injector and the substrate extends from a reagent injection face of the reagent injector to a deposition surface of the substrate.

Suitable substrates for use in growth of a range of group III metal nitride films using RPECVD are known in the art and will not be repeated in detail herein. In short, the substrate may comprise a ceramic material or crystalline or non-crystalline matter, or a mixture of the two. It may comprise, for example, sapphire, silica, soda lime glass, borosilicate glass, Pyrex®, silicon, glass, synthetic sapphire, quartz, or a crystalline material having a lattice closely matched to gallium nitride. In the case in which the semiconductor to be formed is gallium nitride, the substrate may be zinc oxide, SiC, gallium nitride, HfN, AlGaN, for example.

In one preferred embodiment of the present invention, a flow of a scavenging gas is provided through the plasma flow path and/or into the reaction chamber directly and/or through the metal organic injection pathway so as to remove contaminants such as oxygen, carbon and the like. This may be introduced into the plasma chamber with the nitrogen gas which is used in the generator, or may be introduced directly into the reaction chamber via a separate fitting or via the reagent injector. Thus the apparatus may be fitted with a scavenging gas injector.

A suitable scavenging gas will be any gas which can provide an active source of hydrogen. In a preferred embodiment the scavenging gas is ammonia and/or hydrogen gas. The scavenging gas injector may, therefore, comprise an ammonia bubbler as ammonia is capable of generating active hydrogen when injected into the plasma or into the reaction chamber. The active hydrogen will act to scavenge oxygen, carbon or other contaminants.

In certain embodiments of the invention, a surfactant may be injected into the reaction chamber during film growth. It is known that films of gallium nitride commonly exhibit a broad band in the yellow wavelength range of the photoluminescence spectrum. The width and intensity of this band has been equated with poor film quality. Thus, in general, the less intense the yellow band the better the film quality. The inventors have found that the yellow band may be at least partially suppressed by injection of a surfactant.

A suitable surfactant has been shown to be an indium species. Particularly suitable indium species include organic compounds of indium such as trialkyl indium compounds. The alkyl group may, for example, be a C1 to C6 straight chain or C3 to C6 branched chain alkyl group, such as methyl, ethyl, propyl, isopropyl or butyl. A suitable compound is trimethyl indium. Indium metal may be used either additionally or alternatively to an organic compound of indium.

The surfactant or indium species may be injected with the group III metal reagent through the reagent injector. For a particular chamber volume of about 12 L, the surfactant or indium species may be injected at about 0.1 to about 10 sccm, or about 0.1 to 5 sccm. It may be injected at a ratio of about 1 to about 5% relative to the reagent on a weight or mole basis. When such an indium species is used as a surfactant, little or no indium is found to be incorporated into the resulting film and, in addition, the growth rate is higher. The indium species may comprise, or consist essentially of, trimethyl indium. It may comprise, or consist essentially of, indium metal.

The use of this surfactant has provided surprisingly efficacious effects in reducing the width and intensity of the band in the yellow wavelength range of the photoluminescence spectrum for gallium nitride films as is further described and demonstrated in the examples section and associated figures. This indicates that a higher quality film has been obtained without negative side effects resulting from the presence of surfactant.

The supply of the reactive nitrogen species to the reaction chamber and/or the flow of metal organic reagent may be pulsed. The supply of the reactive nitrogen species to the reaction chamber may be pulsed by pulsing plasma generation. This may be achieved by pulsing the supply of nitrogen to the plasma generator or by pulsing the flow of said nitrogen plasma species to the reaction chamber (e.g. by repeatedly opening and closing an aperture leading from the plasma generator to the reaction chamber).

So that the invention may be more readily understood and put into practical effect, the skilled person is referred to the following non-limiting examples.

Examples and Results

Operating Conditions

The equipment described has been specifically designed for use during a remote plasma chemical vapour deposition process for growth of group III metal nitride films. The pressure range of operation is between 0.1 and 15 Torr with a growth temperature range of between 500° C. and 900° C. The inverse pagoda baffle which isolates the plasma generation zone from the deposition chamber is actively water cooled which enables a larger range of RF power to be applied without compromising the decomposition of group III metal organic species before reaching the deposition.

Flow Modelling on Inverse Pagoda Baffle

Modelling was carried out to gain a better understanding of the effect of the inverse pagoda baffle on plasma flow. Process behaviour inside the deposition chamber (such as gas flow uniformity) was analysed against interpretations made after characterization of samples grown in the tool.

Model setup: A 3D approach to the modelling was taken since the chamber design on the apparatus dictates that it cannot be represented accurately in a 2D rotationally symmetric model.

Process conditions: process conditions selected for the model were as follows:

Process pressure=1-3 Torr

Volumetric flow rate to plasma=1000 sccm $N_2$

Volumetric flow rate through reagent bubbler=10-300 sccm $N_2$ (chemistry not modelled therefore bubbler temperature and pressure not relevant).

Figure 6:
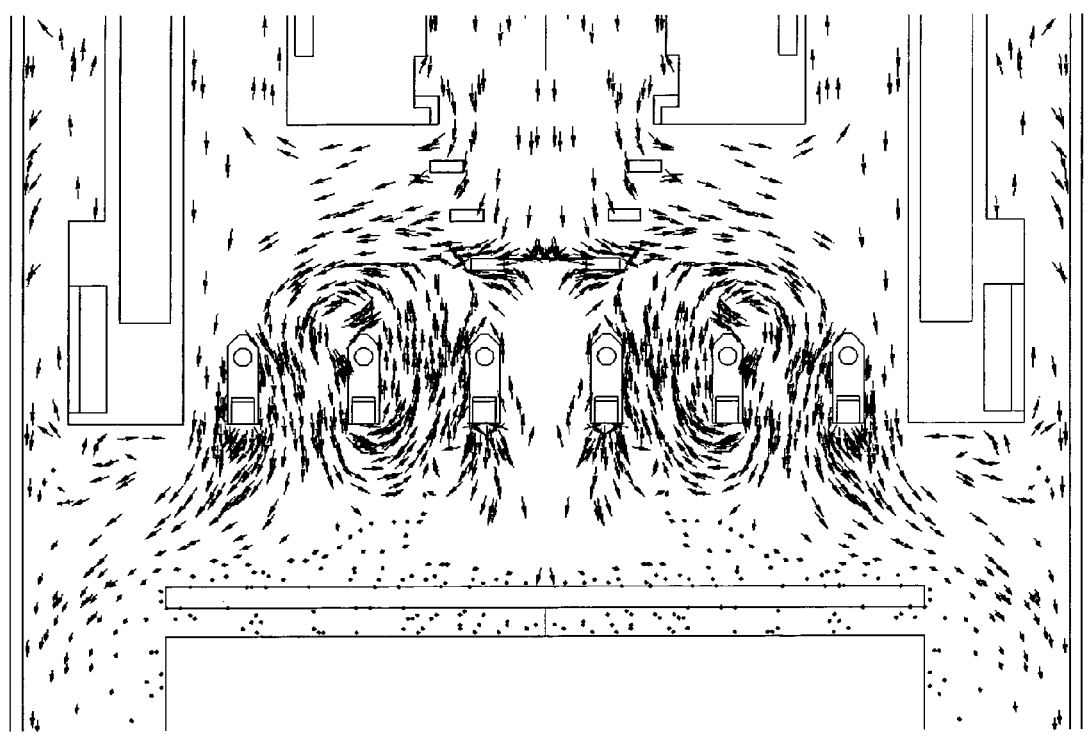
FIG. 6 is a computer modelled image representing one embodiment of plasma gas flow through an inverse pagoda baffle and a reagent injector.

FIG. 6 is a computer modelled image representing one embodiment of plasma gas flow through an inverse pagoda baffle and a reagent injector. Although representing a considerable improvement upon prior art baffles, this embodiment of the inverse pagoda baffle results, to some extent, in return flow zones in the gas volume above the substrate. This is due to the size of the pagoda relative to the deposition area diameter. The return flow zones may result in a diffusion of the reagent material upstream of the substrate position. This can result in parasitic reactions in the gas phase and unwanted wall deposition, leading to a reduction in metal organic usage efficiency (growth rate) and gas phase pre-reactions.

Figure 7:
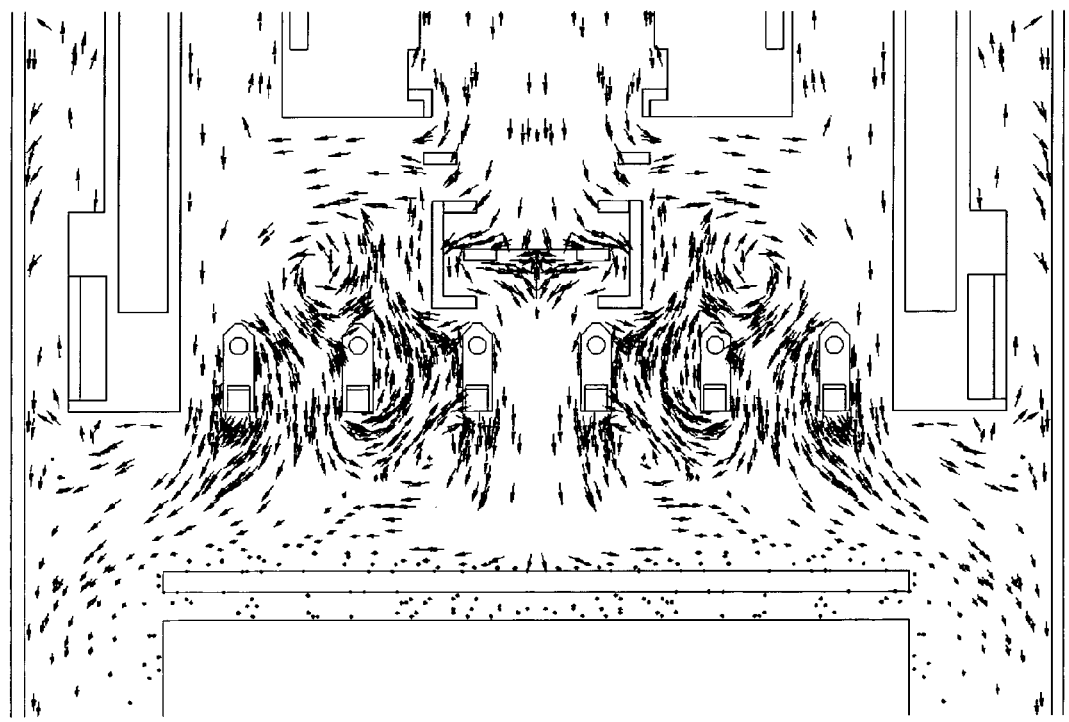
FIG. 7 is a computer modelled image representing a further embodiment of plasma gas flow through an inverse pagoda baffle and a reagent injector.

FIG. 7 is a computer modelled image representing a further embodiment of plasma gas flow through an inverse pagoda baffle and a reagent injector. This iteration on the design of the inverse pagoda baffle increases the gas flow through the centre of the deposition chamber (as indicated by the velocity vectors). This will result in less re-circulations in the centre of the deposition chamber.

Figure 8:
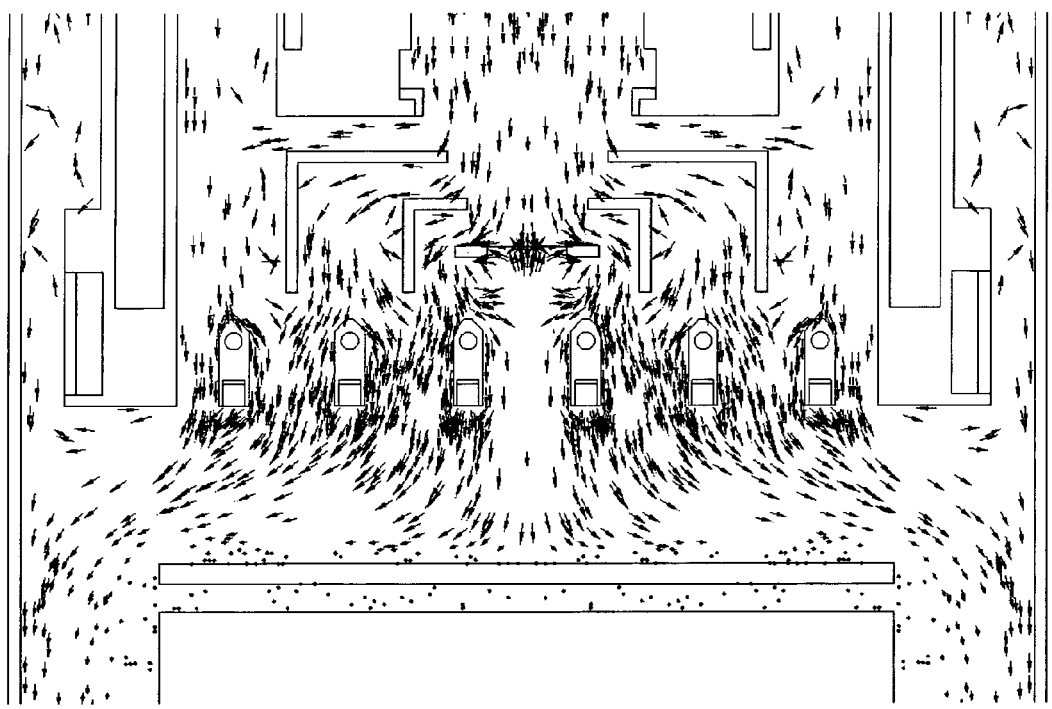
FIG. 8 is a computer modelled image representing yet a further embodiment of plasma gas flow through an inverse pagoda baffle and a reagent injector.

FIG. 8 is a computer modelled image representing yet a further embodiment of plasma gas flow through an inverse pagoda baffle and a reagent injector. This design iteration on the inverse pagoda baffle uses projections to re-direct the flow of gas from the horizontal direction to the vertical direction. As indicated by the gas velocity vectors, this substantially eliminates the return flow zones in the gas volume thereby improving process behaviour and representing a particularly preferred embodiment of the invention.

Velocity Measurements Using Inverse Pagoda Baffle

Figure 9:
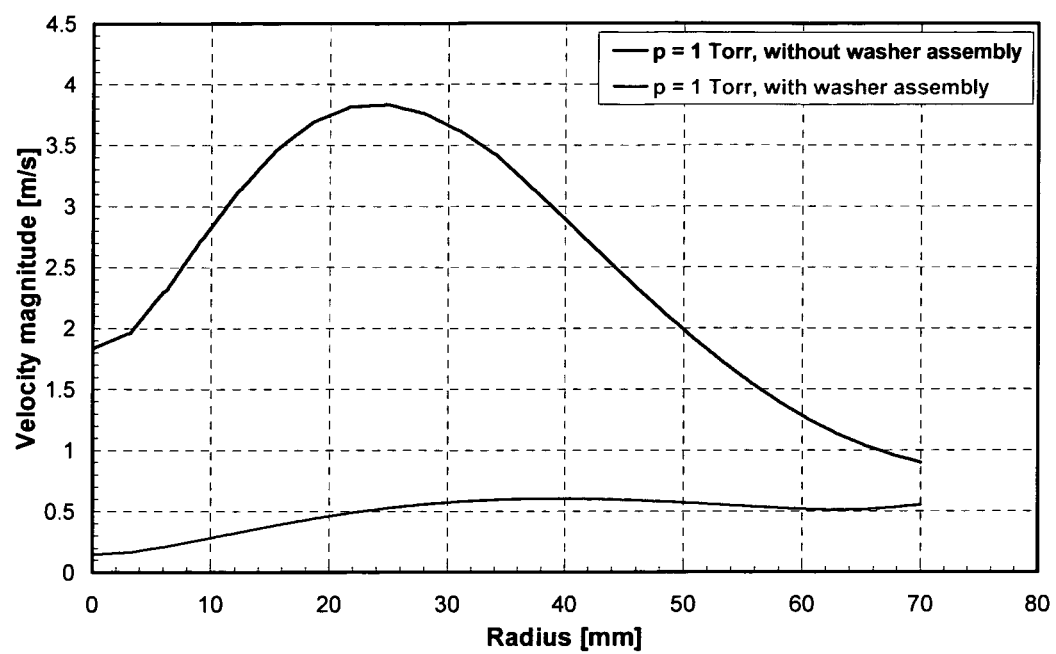
FIG. 9 shows a velocity profile measured above the sample holder surface with and without the use of an inverse pagoda baffle.

FIG. 9 shows a velocity profile measured approximately 5 mm above the sample holder surface with and without the use of the inverse pagoda baffle (referred to in the legend as a washer assembly). The apparatus employed was substantially as described before and in line with that set out in FIG. 2. The velocity profile was measured radially from centre to edge of the sample holder, for process pressure=1 Torr. Velocity magnitude close to the position of the sample holder is seen to be a factor of 5 higher without the inverse pagoda baffle (uppermost line on graph), and uniformity of the gas flow is approximately 7% worse showing a relatively steep peak.

These results are strongly indicative of the advantageous effect of the inverse pagoda baffle on plasma velocity and uniformity. The decrease in velocity obtained by its use minimises unwanted perturbations in the deposition zone and the uniformity achieved results in a more homogeneous, higher quality metal nitride film being produced.

When the residence time of the growth contributing species in the deposition chamber is considered i.e. how long the species are present before being consumed by the growth mechanism, gas phase nucleation effects or exhausted from the reactor, the absence of return flow zones is better for the process as residence time will be substantially increased for species in these zones. When going to higher process pressures the gas velocity reduces and hence residence time becomes longer, and the effects mentioned previously (pre-reactions etc) become more pronounced.

Effect of Scavenging Gas

Experiments were performed introducing hydrogen gas along with the plasma and, alternatively, injecting it with the group III metal reagent from the reagent injector. The results are shown in FIG. 9 which is a profile of ammonia ($NH_3$) and methane ($CH_4$) production as a function of delivery time and hydrogen supply.

Figure 10:
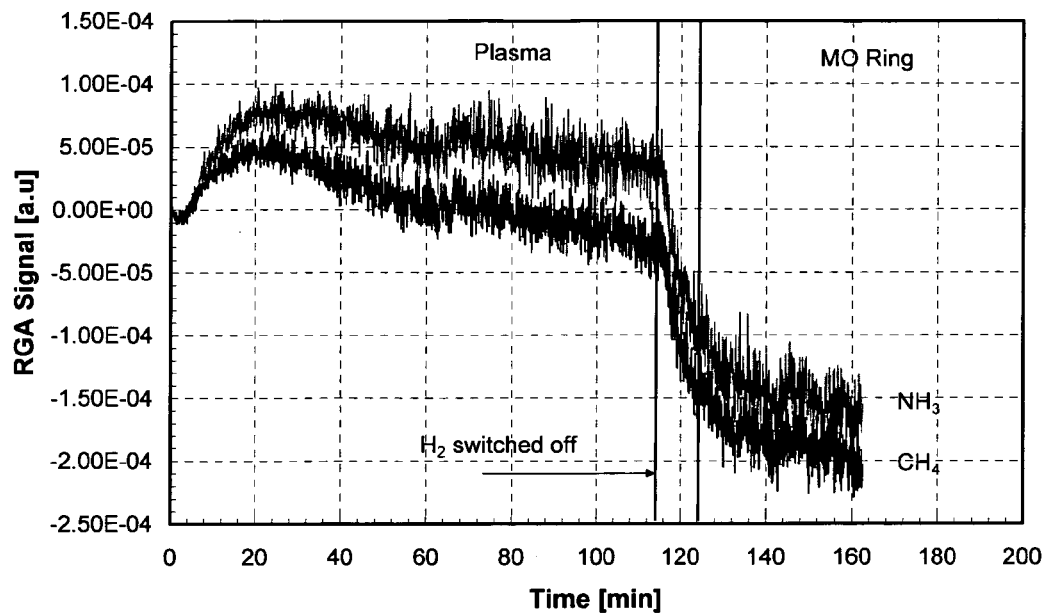
FIG. 10 is a profile of ammonia ($NH_3$) and methane ($CH_4$) production as a function of delivery route and hydrogen supply.

FIG. 10 shows that initially the hydrogen is flowing in with the plasma and both ammonia and methane production are elevated. As the first dotted line is reached at approximately 110 min the hydrogen supply is switched off and both ammonia and methane production are seen to drop off sharply. At the second dotted line at approximately 130 min the hydrogen supply is switched backed on but is introduced through the reagent injector otherwise known as the metal organic supply ring (MO). Ammonia and methane levels are seen to remain low.

When hydrogen is supplied to the reaction chamber it can form ammonia by reaction with nitrogen and can form methane by reaction with a carbon source such as the organic component of the group III metal organic reagent. Both ammonia and methane are useful in scavenging excess active nitrogen species and carbon contaminants, respectively. Particularly, in the case of trimethyl gallium being used as the metal reagent, increased methane production is a strong indicator of the desirable dissociation of that reagent as the methyl groups pick up hydrogen upon dissociation from the metal. In the absence of this reaction the methyl groups would normally decompose on the film surface thereby contaminating the growing film.

Thus, FIG. 10 demonstrates that hydrogen delivered through the plasma line is an effective scavenger gas. Plasma line delivery is to be preferred to delivery through the reagent injector.

Figure 11:
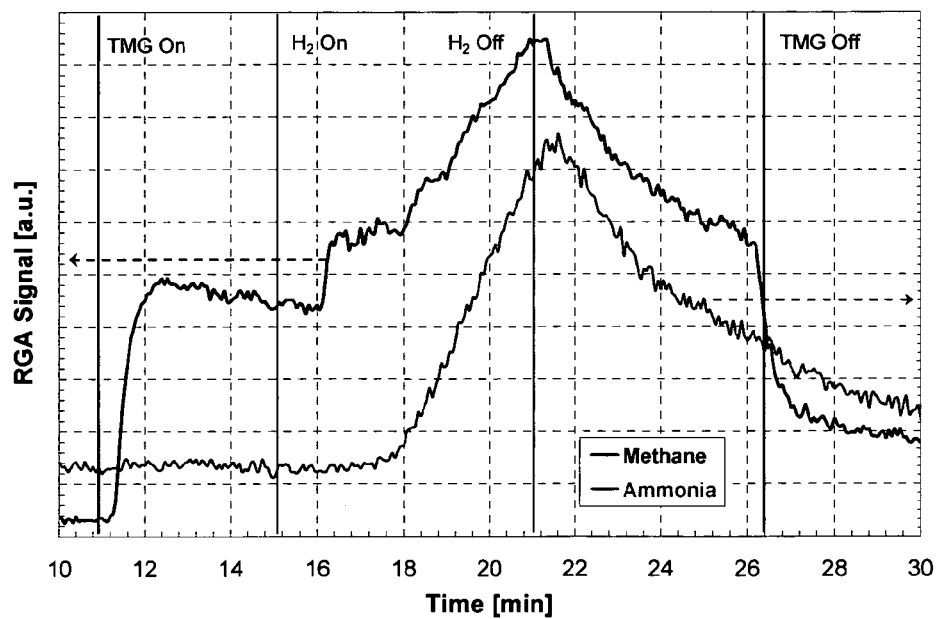
FIG. 11 is a profile of variation in production of methane and ammonia with variation in hydrogen and trimethyl gallium supply.

FIG. 11 is a profile of variation in production of methane and ammonia with variation in hydrogen and trimethyl gallium supply. This experiment was run at 730° C. with Y-values normalised with respect to the $N_2$ RGA signal (6.5 ccm TMG, 650 ccm $N_2$, 5 ccm $H_2$).

FIG. 11 further confirms what has been discussed above. Again, methane and ammonia production increase dramatically upon hydrogen being supplied and dropped off once the supply is stopped indicating the efficacy of this gas in scavenging potential film contaminants.

Figure 12:
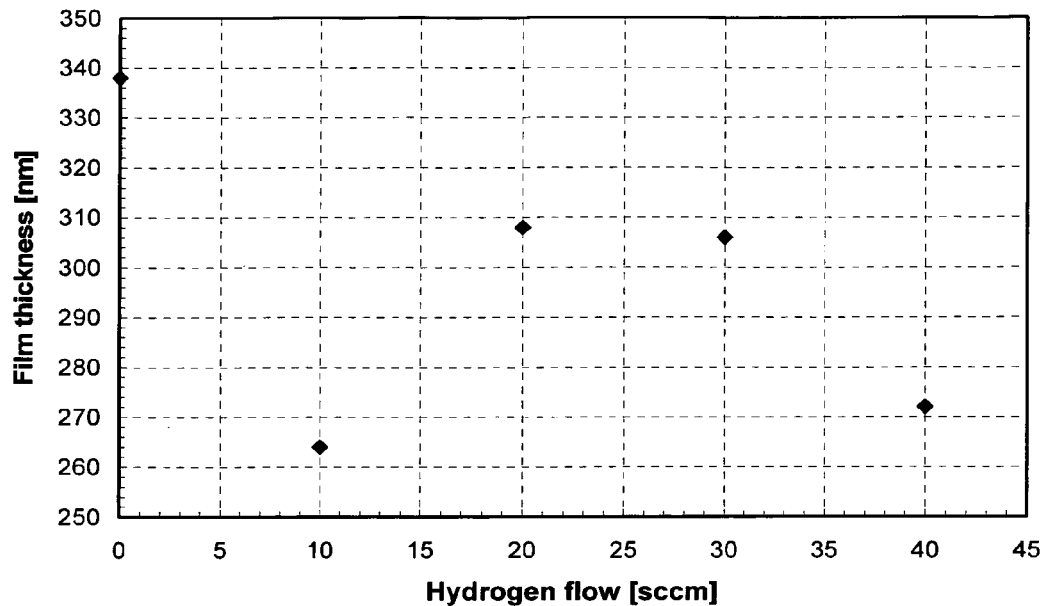
FIG. 12 is a graphical representation of film thickness achieved with variation in hydrogen scavenging gas supply.

FIG. 12 is a graphical representation of film thickness achieved with variation in hydrogen scavenging gas supply. FIG. 12 indicates the importance of achieving a balance between competing mechanisms which exist under hydrogen scavenging gas flow. Although hydrogen flow is desirable for the reasons discussed above of removing film contaminants such as carbon and active nitrogen species it has the potential drawback of also removing useful nitrogen and group III metal reagent.

FIG. 12 shows that film thickness is greatest when there is no hydrogen flow. This seems desirable but is not an indicator of film quality which would not be ideal due to the aforementioned impurities. Film thickness drops upon the introduction of hydrogen flow but then increases up until a flow of approximately 20-30 sccm hydrogen before dropping off again. This hydrogen flow range represents a desirable balance between the factors mentioned to achieve a film substantially free of impurities but also achieving an acceptable film thickness in a reasonable time frame.

Figure 13:
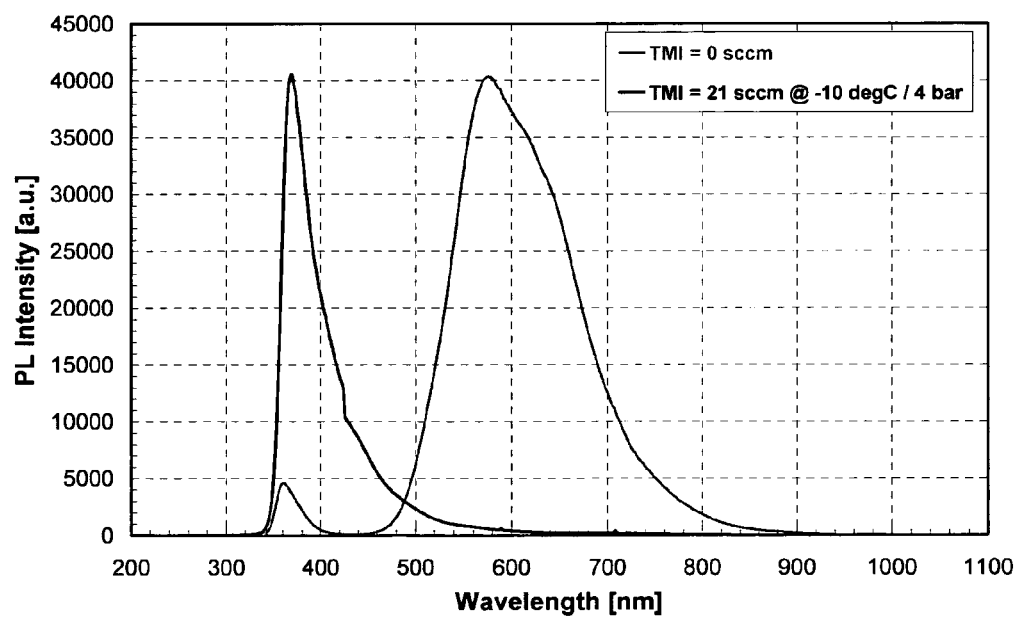
FIG. 13 is a trace of photoluminescence (PL) intensity against wavelength showing the effect of the introduction of trimethyl indium (TMI) as a surfactant on film quality.

FIG. 13 is a trace of photoluminescence (PL) intensity against wavelength showing the effect of the introduction of trimethyl indium (TMI), as a surfactant, on film quality. The trace in grey (rightmost and broadest peak) represents the film formed without the introduction of trimethyl indium and the black line (leftmost and thinnest peak) that with the introduction of 21 sccm trimethyl indium. The effect is dramatically clear resulting in a strong increase in UV band-edge emission and a reduction in the yellow region which indicates that the film is of a higher purity and better optical quality.

CONCLUSION

The use of an inverse pagoda baffle, being any baffle which displays the previously described qualities of overlapping spaced members each defining an aperture above a member without an aperture, greatly improves gas flow uniformity as the nitrogen plasma species move towards the sample holder surface. Without the inverse pagoda baffle gas velocity is significantly higher over the sample surface leading to difficulties in trying to maintain homogeneous deposition in this location.

The inverse pagoda baffle ensures that a minimum amount of highly energetic ionic species pass into the deposition chamber to result in an etching effect on the substrate and/or growing film surface where the highly energetic species would damage the film being deposited. The same is true of the active species for growth (neutral metastable molecular nitrogen).

A balance must be achieved between concentration of active species passing through the baffle and the amount being destroyed via collisions with the surface of the baffle and also the sides of the tubes through which the gaseous species must pass to thereby fulfil the two main requirements for the process which are (a) uniform distribution of plasma over the entire growth area and (b) achieving a concentration of appropriate active plasma species necessary for growth. An inverse pagoda baffle as described herein has been found to achieve these goals to a surprisingly high degree by comparison with standard baffle plates discussed in the art.

Further, the introduction of a hydrogen source as a scavenging gas has been shown to be extremely effective in reducing the level of contaminants available for inclusion into the growing film.

The present inventors have also demonstrated that variation of certain distances within the reaction chamber can be extremely important in manipulating a number of factors which all influence film growth and/or quality.

Finally, the problem of the yellow wavelength band effect in gallium nitride films has been effectively overcome by the introduction of an indium species surfactant to provide a further increase in film quality.

The above described components and effects, either alone or in combination, all contribute to producing a group III metal nitride film with a uniformity and level of purity and quality which is not to be found in the prior art.

Throughout the specification the aim has been to describe the preferred embodiments of the invention without limiting the invention to any one embodiment or specific collection of features. It will therefore be appreciated by those of skill in the art that, in light of the instant disclosure, various modifications and changes can be made in the particular embodiments exemplified without departing from the scope of the present invention.

The invention claimed is:

1. An apparatus for depositing a group III metal nitride film on a substrate, the apparatus comprising:
   (a) a plasma generator to generate a nitrogen plasma from a nitrogen source;
   (b) a reaction chamber in which to react a reagent comprising a group III metal with a reactive nitrogen species derived from the nitrogen plasma so as to deposit a group III metal nitride on the substrate;
   (c) a plasma inlet to facilitate the passage of nitrogen plasma from the plasma generator into the reaction chamber; and
   (d) a baffle having one or more flow channels for passage of the nitrogen plasma, the baffle located between the plasma inlet and the substrate and the baffle comprising a plurality of distribution members located above a blocking member, each distribution member defining an aperture and being spaced from adjacent distribution members and the blocking member, wherein the apertures defined by the distribution members are progressively smaller upon approaching the blocking member, and
   wherein the baffle prevents a straight line of passage for nitrogen plasma between the plasma inlet and the substrate.

2. The apparatus of claim 1 wherein consecutive distribution members and the blocking member are at least partially overlapping.

3. The apparatus of claim 1 wherein adjacent distribution members and the blocking member are connected by one or more circumferentially disposed connecting members.

4. The apparatus of claim 1 wherein each circumferentially disposed connecting member is circumferentially offset from those connecting members located immediately above and below.

5. The apparatus of claim 1 wherein the plurality of distribution members are rings and the blocking member is a solid disc and wherein the rings are of progressively smaller diameter with the smallest diameter ring located adjacent the solid disc.

6. The apparatus of claim 5 wherein the rings are substantially parallel to one another.

7. The apparatus of claim 6 wherein the parallel rings are disposed in a plane substantially perpendicular to the direction of flow of nitrogen plasma from the plasma inlet.

8. The apparatus of claim 1 wherein one or more of the distribution members comprise a projection to direct the nitrogen plasma in a substantially vertical downwards direction.

9. The apparatus of claim 1 wherein the group III metal nitride film is a gallium nitride film.

10. The apparatus of claim 1 wherein the baffle filters out high energy unwanted reactive nitrogen plasma species to prevent their contacting the substrate.

* * * * *